United States Patent
Jung

(10) Patent No.: US 7,563,708 B2
(45) Date of Patent: Jul. 21, 2009

(54) METHOD FOR MANUFACTURING SEMICONDUCTOR DEVICE

(75) Inventor: Sang Yong Jung, Bucheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 196 days.

(21) Appl. No.: 11/819,857

(22) Filed: Jun. 29, 2007

(65) Prior Publication Data

US 2008/0153288 A1    Jun. 26, 2008

(30) Foreign Application Priority Data

Dec. 26, 2006    (KR) .................. 10-2006-0134075

(51) Int. Cl.
*H01L 21/4763* (2006.01)
(52) U.S. Cl. .................. 438/637; 438/638; 438/657; 438/684
(58) Field of Classification Search .......... 438/622, 438/624, 637, 638, 639, 645, 657, 659, 672, 438/684
See application file for complete search history.

(56) References Cited

U.S. PATENT DOCUMENTS

| | | | |
|---|---|---|---|
| 6,541,374 B1 * | 4/2003 | de Felipe et al. | 438/648 |
| 6,838,369 B2 * | 1/2005 | Lee et al. | 438/622 |
| 2007/0082484 A1 * | 4/2007 | Kang et al. | 438/637 |

FOREIGN PATENT DOCUMENTS

| | | |
|---|---|---|
| JP | 2002-231906 | 8/2002 |
| KR | 10-2004-0002280 | 1/2004 |
| KR | 10-2004-0059908 | 7/2004 |
| KR | 10-2006-0065315 | 6/2006 |

* cited by examiner

*Primary Examiner*—Kevin M Picardat
(74) *Attorney, Agent, or Firm*—Finnegan, Henderson, Farabow, Garrett & Dunner, L.L.P.

(57) ABSTRACT

A method for manufacturing a semiconductor device includes implanting metal ions on a residual interlayer dielectric film in a storage contact hole to the residual dielectric film, thereby reducing a contact resistance to prevent failures of the semiconductor device.

8 Claims, 3 Drawing Sheets

METHOD FOR MANUFACTURING SEMICONDUCTOR DEVICE

CROSS-REFERENCES TO RELATED APPLICATIONS

The present application claims the benefit of priority to Korean patent application number 10-2006-0134075, filed on Dec. 26, 2006, the entire contents of which are incorporated herein by reference.

BACKGROUND

The present invention relates generally to a method for manufacturing a semiconductor device and, more specifically, to a method for implanting metal ions into a residual interlayer dielectric film during formation of a storage node contact hole to the residual interlayer dielectric film, thereby reducing a contact resistance of the semiconductor device.

As semiconductor devices become smaller and more highly integrated, the memory capacity of the semiconductor devices becomes higher, and the cell area of the semiconductor devices becomes smaller.

In order to secure a capacitance value of a capacitor in the cell area, a storage node may be designed to have a maximum possible area.

The storage node may be required to be arranged in a zigzag type, so that the storage node may have a maximum area in the cell area. However, the storage nodes may be dislocated in a given portion, because the zigzag arrangement does not correspond to the lower storage node contact arrangement.

A second storage node contact may be formed between the first storage node contact and the storage node, so as to connect the dislocated storage nodes electrically.

When a photo-etching process is performed to form the second storage node contact, the interlayer dielectric film of a region, where a second storage contact hole is formed, may remain to cause a contact-not-open phenomenon.

The contact-not-open phenomenon may degrade the performance of a semiconductor device and cause failures in the semiconductor device.

SUMMARY

In one aspect, there is provided a method for manufacturing a semiconductor device. The method includes implanting metal ions into a residual interlayer dielectric film in a storage node contact hole to the residual interlayer dielectric film, thereby reducing a contact resistance to prevent failures of the semiconductor device.

In another aspect, there is provided a method for manufacturing a semiconductor device. The method includes forming a first interlayer dielectric film over a semiconductor substrate, the first interlayer dielectric film having a first storage node contact plug formed therein; forming a second interlayer dielectric film over the first interlayer dielectric film; selectively etching the second interlayer dielectric film to form a second storage node contact hole with a residual of second interlayer dielectric film remained on the first storage node contact plug; implanting metal ions into the residual and an upper surface of the second interlayer dielectric film; depositing a polysilicon layer on the ion-implanted second interlayer dielectric film and in the second storage node contact hole; and planarizing the polysilicon layer to expose the second interlayer dielectric film, thereby forming a second storage node contact plug.

The metal ions may be selected from the group consisting of Al, Ga, P, As, and combinations thereof.

The implanting step may be performed with a doping concentration ranging from about $1 \times 10^{20}$ to $1 \times 10^{23}$ Dose/cm$^3$.

The second storage node contact hole may be formed to expose the first storage node contact plug.

The line-width of the second storage node contact hole may be greater than that of the first storage node contact.

Planarizing the interlayer dielectric film may include removing an ion-implanted part of the interlayer dielectric film at a predetermined depth.

DETAILED DESCRIPTION

Figure 1A:
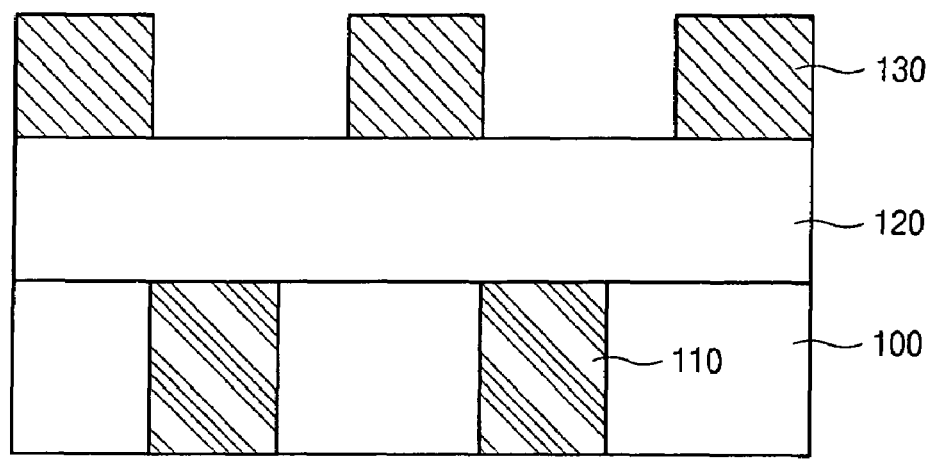
FIGS. 1a through 1e are cross-sectional diagrams illustrating a method for manufacturing a semiconductor device according to one embodiment consistent with the present invention.

The present invention will be described in detail with reference to the accompanying drawings.

FIGS. 1a through 1e are cross-sectional diagrams illustrating a method for manufacturing a semiconductor device according to one embodiment consistent with the present invention.

A first interlayer dielectric film 100 may be formed over a semiconductor substrate (not shown) including a gate and a bit line.

First interlayer dielectric film 100 is selectively etched to form a first storage node contact hole. The first storage node contact hole is filled with a polysilicon material to form a first storage node contact plug 110.

A second interlayer dielectric film 120 is formed over the resulting structure, and a photoresist film is formed over second interlayer dielectric film 120. An exposure and developing process may be performed using an exposure mask to form a second storage node contact hole. A photoresist pattern 130 is formed to define the second storage node contact hole.

Second interlayer dielectric film 120 is etched using photoresist pattern 130 as a mask to form a second interlayer dielectric pattern 125 that defines a second storage node contact hole 140.

Second storage contact hole 140 may be formed to have a larger line-width than that of first storage node contact plug 110 in order to connect first storage node contact plug 110 with a wider area.

Figure 1B:
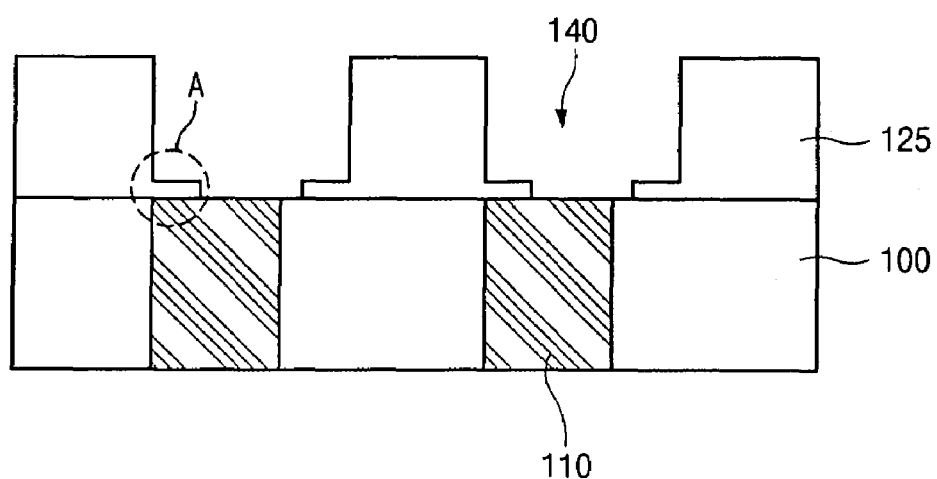

When a photo-etching process is performed to form second interlayer dielectric pattern 125, a residual A of second interlayer dielectric film 120 remains on first storage node contact plug 110, as shown in FIG. 1b.

An ion-implanting process may be performed on the resulting structure of FIG. 2b using metal ions.

The metal ions are selected from the group consisting of Al, Ga, P, As, and combinations thereof.

The ion-implanting process may be performed with a doping concentration ranging from about $1 \times 10^{20}$ to $1 \times 10^{23}$ Dose/cm$^3$.

The ion-implanting process may be performed on residual A of second interlayer dielectric film 120 and on an upper surface of second interlayer dielectric pattern 125 to a predetermined depth.

The ion-implanting process s residual A even when residual A of second interlayer dielectric film 120 remains on first storage node contact plug 110. As a result, residual A becomes conductive so that current may flow.

Residual A of second interlayer dielectric film 120 can prevent failures of a semiconductor device resulting from the contact-not-open phenomenon.

Figure 1C:
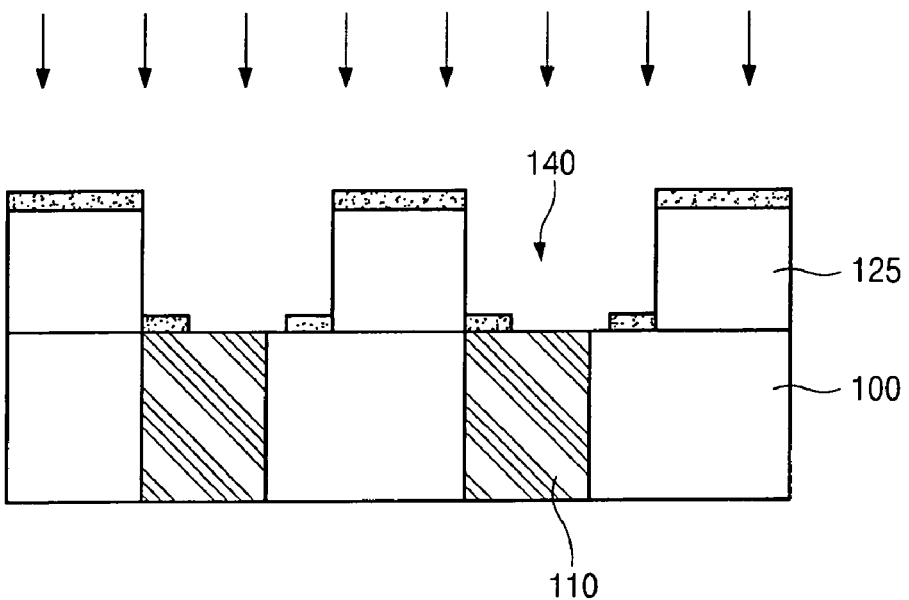

A polysilicon layer 150 is formed over the resulting structure of FIG. 1c, that is, on the ion-implanted second interlayer dielectric pattern 125 and in second storage node contact hole 140.

Figure 1D:
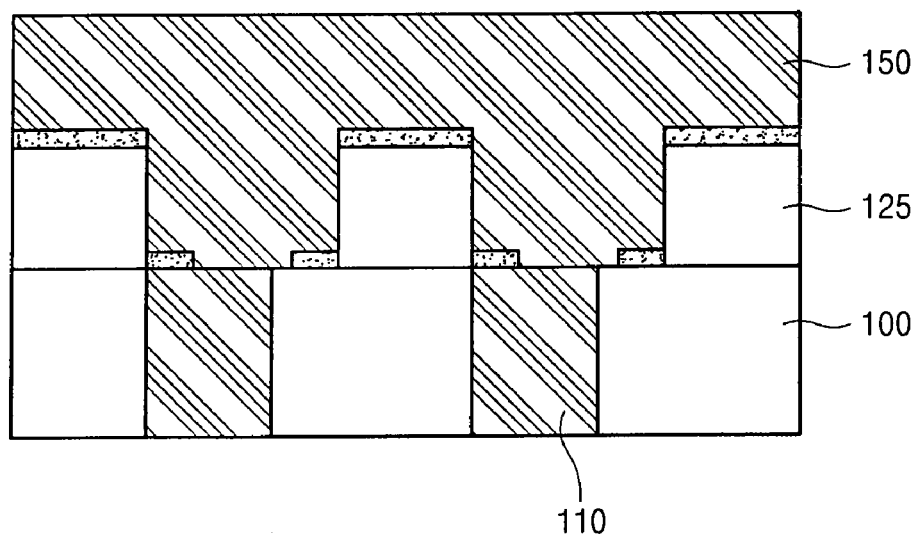
Figure 1E:
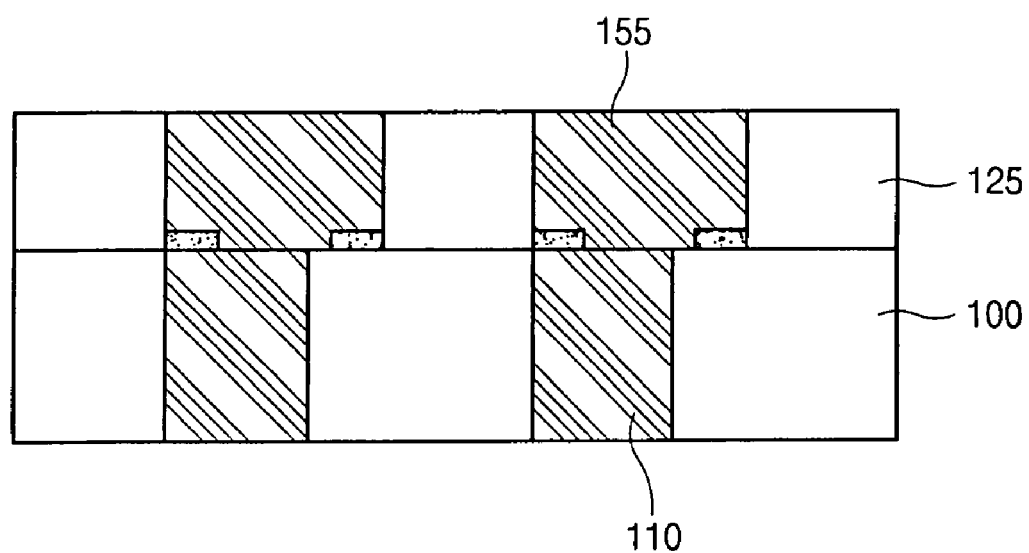

A planarization process may be performed to the resulting structure of FIG. 1d until second interlayer dielectric pattern 125 is exposed, thereby forming a second storage node contact plug 155.

The planarization process may be performed to remove the ion-implanted part of second interlayer dielectric pattern 125 at the predetermined depth.

As described above, a method for manufacturing a semiconductor device according to one embodiment consistent with the present invention may include implanting metal ions into a residual interlayer dielectric film in a storage contact hole to the residual interlayer dielectric film, thereby reducing a contact resistance to prevent failures of a semiconductor device.

The above embodiments consistent with the present invention are illustrative and not limitative. Various alternatives and equivalents are possible. The invention is not limited by the lithography steps described herein. Nor is the invention limited to any specific type of semiconductor devices. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for manufacturing a semiconductor device, the method comprising:

forming a first interlayer dielectric film over a semiconductor substrate, the first interlayer dielectric film having a first storage node contact plug formed therein;

forming a second interlayer dielectric film over the first interlayer dielectric film;

selectively etching the second interlayer dielectric film to form a second storage node contact hole;

implanting metal ions into the second storage node contact hole such that a possible dielectric residual in the second storage node contact hole can have conductive property; and filling a conductive layer into the second storage node contact hole to form a second storage node contact plug.

2. The method according to claim 1, wherein the metal ions are implanted into the residual and an upper surface of the second interlayer dielectric film.

3. The method according to clam 1, further comprises the depositing a polysilicon layer on the ion-implanted second interlayer dielectric film and in the second storage node contact hole; and planarizing the polysilicon layer to expose the second interlayer dielectric film, thereby forming a second storage node contact plug.

4. The method according to claim 1, wherein the metal ions are selected from the group consisting of Al, Ga, P, As, and combinations thereof.

5. The method according to claim 1, wherein the metal ions are implanted with a doping concentration ranging from about $1 \times 10^{20}$ to $1 \times 10^{23}$ Dose/cm$^3$.

6. The method according to claim 1, wherein the second storage node contact hole is formed to expose the first storage node contact plug.

7. The method according to claim 1, wherein the second storage node contact hole has a line-width greater than that of the first storage node contact.

8. The method according to claim 2, further comprises planarizing the polysilicon layer to a predetermined depth to remove the ion-implanted upper surface of the second interlayer dielectric film.

* * * * *